(12) United States Patent
Beffa

(10) Patent No.: US 7,885,782 B2
(45) Date of Patent: *Feb. 8, 2011

(54) METHOD IN AN INTEGRATED CIRCUIT (IC) MANUFACTURING PROCESS FOR IDENTIFYING AND REDIRECTING ICS MIS-PROCESSED DURING THEIR MANUFACTURE

(75) Inventor: Raymond J. Beffa, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 275 days.

This patent is subject to a terminal disclaimer.

(21) Appl. No.: 11/582,141

(22) Filed: Oct. 17, 2006

(65) Prior Publication Data

US 2007/0094632 A1 Apr. 26, 2007

Related U.S. Application Data

(63) Continuation of application No. 11/150,752, filed on Jun. 10, 2005, now Pat. No. 7,124,050, which is a continuation of application No. 10/600,148, filed on Jun. 19, 2003, now Pat. No. 6,944,567, which is a continuation of application No. 10/067,728, filed on Feb. 4, 2002, now Pat. No. 6,594,611, which is a continuation of application No. 09/793,938, filed on Feb. 27, 2001, now Pat. No. 6,363,329, which is a continuation of application No. 09/537,839, filed on Mar. 29, 2000, now Pat. No. 6,208,947, which is a continuation of application No. 09/302,338, filed on Apr. 29, 1999, now Pat. No. 6,067,507, which is a continuation of application No. 08/806,442, filed on Feb. 26, 1997, now Pat. No. 5,915,231.

(51) Int. Cl.
G01R 31/00 (2006.01)
G01R 31/14 (2006.01)
G01N 37/00 (2006.01)

(52) U.S. Cl. ........................................ 702/118; 702/82

(58) Field of Classification Search ......... 702/117–119, 702/81, 82, 84; 700/116, 224–226, 95, 109, 700/115; 438/14
See application file for complete search history.

(56) References Cited

U.S. PATENT DOCUMENTS 4,027,246 A 5/1977 Caccoma et al.

(Continued)

FOREIGN PATENT DOCUMENTS

EP 0849675 A2 6/1998
JP 58050728 A 3/1983

(Continued)

OTHER PUBLICATIONS

Fresonke, Dean, *In-Fab Identification of Silicon Wafers with Clean, Laser Marked Barcodes*, Advanced Semiconductor Manufacturing Conference and Workshop, 1994, IEEE/SEMI, pp. 157-160.

*Primary Examiner*—Michael P Nghiem
(74) *Attorney, Agent, or Firm*—TraskBritt

(57) ABSTRACT

A method of manufacturing IC devices from semiconductor wafers includes providing the wafers and fabricating ICs on the wafers. At probe, a unique fuse ID is stored in each IC, and an electronic wafer map is electronically stored for each wafer indicating the locations of good and bad ICs on the wafer and the fuse IDs of the ICs on the wafer. Each IC is then separated from its wafer to form an IC die, and the IC dice are assembled into IC devices. At the opens/shorts test at the end of assembly, the fuse ID of each IC in each device is automatically retrieved so the wafer map of the IC device may be accessed and evaluated to identify any IC devices containing bad ICs that have accidentally been assembled into IC devices. Any "bad" IC devices are discarded while remaining IC devices continue on to back-end testing.

12 Claims, 2 Drawing Sheets

U.S. PATENT DOCUMENTS

| | | |
|---|---|---|
| 4,032,949 A | 6/1977 | Bierig |
| 4,150,331 A | 4/1979 | Lacher |
| 4,454,413 A | 6/1984 | Morton, Jr. |
| 4,455,495 A | 6/1984 | Masuhara et al. |
| 4,460,999 A | 7/1984 | Schmidt |
| 4,510,673 A | 4/1985 | Shils et al. |
| 4,534,014 A | 8/1985 | Ames |
| 4,667,403 A | 5/1987 | Edinger et al. |
| 4,736,373 A | 4/1988 | Schmidt |
| 4,796,194 A | 1/1989 | Atherton |
| 4,871,963 A | 10/1989 | Cozzi |
| 4,954,453 A | 9/1990 | Venutolo |
| 4,958,373 A | 9/1990 | Usami et al. |
| 4,967,381 A | 10/1990 | Lane et al. |
| 4,985,988 A | 1/1991 | Littlebury |
| 5,003,251 A | 3/1991 | Fuoco |
| 5,014,208 A | 5/1991 | Wolfson |
| 5,043,657 A | 8/1991 | Amazeen et al. |
| 5,103,166 A | 4/1992 | Jeon et al. |
| 5,105,362 A | 4/1992 | Kotani |
| 5,110,754 A | 5/1992 | Lowrey et al. |
| 5,118,369 A | 6/1992 | Shamir |
| 5,175,774 A | 12/1992 | Traux et al. |
| 5,197,650 A | 3/1993 | Monzen et al. |
| 5,217,834 A | 6/1993 | Higaki |
| 5,219,765 A | 6/1993 | Yoshida et al. |
| 5,226,118 A | 7/1993 | Baker et al. |
| 5,235,550 A | 8/1993 | Zagar |
| 5,253,208 A | 10/1993 | Kang |
| 5,256,562 A | 10/1993 | Vu et al. |
| 5,256,578 A | 10/1993 | Corley et al. |
| 5,271,796 A | 12/1993 | Miyashita et al. |
| 5,289,113 A | 2/1994 | Meaney et al. |
| 5,294,812 A | 3/1994 | Hashimoto et al. |
| 5,296,402 A | 3/1994 | Ryou |
| 5,301,143 A | 4/1994 | Ohri et al. |
| 5,326,709 A | 7/1994 | Moon et al. |
| 5,345,110 A | 9/1994 | Renfro et al. |
| 5,347,463 A | 9/1994 | Nakamura et al. |
| 5,350,715 A | 9/1994 | Lee |
| 5,352,945 A | 10/1994 | Casper et al. |
| 5,355,320 A | 10/1994 | Erjavic et al. |
| 5,360,747 A | 11/1994 | Larson et al. |
| 5,399,531 A | 3/1995 | Wu |
| 5,420,796 A | 5/1995 | Weling et al. |
| 5,424,652 A | 6/1995 | Hembree et al. |
| 5,428,311 A | 6/1995 | McClure |
| 5,440,240 A | 8/1995 | Wood et al. |
| 5,440,493 A | 8/1995 | Doida |
| 5,442,561 A | 8/1995 | Yoshizawa et al. |
| 5,448,488 A | 9/1995 | Oshima |
| 5,450,326 A | 9/1995 | Black |
| 5,467,304 A | 11/1995 | Uchida et al. |
| 5,477,493 A | 12/1995 | Danbayashi |
| 5,483,175 A | 1/1996 | Ahmad et al. |
| 5,495,417 A | 2/1996 | Fuduka et al. |
| 5,504,369 A | 4/1996 | Dasse et al. |
| 5,511,005 A | 4/1996 | Abbe et al. |
| 5,516,028 A | 5/1996 | Rasp et al. |
| 5,537,325 A | 7/1996 | Iwakiri et al. |
| 5,538,141 A | 7/1996 | Gross, Jr. et al. |
| 5,539,235 A | 7/1996 | Allee |
| 5,550,838 A | 8/1996 | Okajima |
| 5,563,832 A | 10/1996 | Kagami |
| 5,568,408 A | 10/1996 | Maeda |
| 5,570,293 A | 10/1996 | Tanaka et al. |
| 5,581,510 A | 12/1996 | Furusho et al. |
| 5,590,069 A | 12/1996 | Levin |
| 5,600,171 A | 2/1997 | Makihara et al. |
| 5,603,412 A | 2/1997 | Gross, Jr. et al. |
| 5,606,193 A | 2/1997 | Ueda et al. |
| 5,617,366 A | 4/1997 | Yoo |
| 5,619,469 A | 4/1997 | Joo |
| 5,625,816 A | 4/1997 | Burdick et al. |
| 5,642,307 A | 6/1997 | Jernigan |
| 5,654,204 A | 8/1997 | Anderson |
| 5,726,074 A | 3/1998 | Yabe |
| 5,764,650 A | 6/1998 | Debenham |
| 5,787,012 A | 7/1998 | Levitt |
| 5,787,190 A | 7/1998 | Peng et al. |
| 5,801,067 A | 9/1998 | Shaw et al. |
| 5,801,965 A | 9/1998 | Takagi et al. |
| 5,805,472 A | 9/1998 | Fukasawa |
| 5,822,218 A | 10/1998 | Moosa et al. |
| 5,828,778 A | 10/1998 | Hagi et al. |
| 5,837,558 A | 11/1998 | Zuniga et al. |
| 5,844,803 A | 12/1998 | Beffa |
| 5,856,923 A | 1/1999 | Jones et al. |
| 5,865,319 A | 2/1999 | Okuda et al. |
| 5,867,505 A | 2/1999 | Beffa |
| 5,889,674 A | 3/1999 | Burdick et al. |
| 5,890,807 A | 4/1999 | Ingel et al. |
| 5,895,962 A * | 4/1999 | Zheng et al. ............... 257/529 |
| 5,907,492 A | 5/1999 | Akram et al. |
| 5,915,231 A | 6/1999 | Beffa |
| 5,927,512 A | 7/1999 | Beffa |
| 5,946,497 A | 8/1999 | Lee et al. |
| 5,950,012 A | 9/1999 | Shiell et al. |
| 5,963,881 A | 10/1999 | Kahn et al. |
| 5,976,899 A | 11/1999 | Farnworth et al. |
| 5,991,699 A | 11/1999 | Kulkarni et al. |
| 5,994,915 A | 11/1999 | Farnworth et al. |
| 6,000,830 A | 12/1999 | Asano et al. |
| 6,018,686 A | 1/2000 | Orso et al. |
| 6,049,624 A | 4/2000 | Wilson et al. |
| 6,055,463 A | 4/2000 | Cheong et al. |
| 6,067,507 A | 5/2000 | Beffa |
| 6,072,574 A | 6/2000 | Zeimantz |
| 6,075,216 A | 6/2000 | Nakamura et al. |
| 6,100,486 A | 8/2000 | Beffa |
| 6,122,563 A | 9/2000 | Beffa |
| 6,130,442 A | 10/2000 | Di Zenzo et al. |
| 6,138,256 A | 10/2000 | Debenham |
| 6,147,316 A | 11/2000 | Beffa |
| 6,148,307 A | 11/2000 | Burdick et al. |
| 6,190,972 B1 | 2/2001 | Zheng et al. |
| 6,194,738 B1 * | 2/2001 | Debenham et al. ............ 257/48 |
| 6,208,947 B1 | 3/2001 | Beffa |
| 6,219,810 B1 | 4/2001 | Debenham |
| 6,226,394 B1 | 5/2001 | Wilson et al. |
| 6,259,520 B1 | 7/2001 | Zeimantz |
| 6,265,232 B1 | 7/2001 | Simmons |
| 6,292,009 B1 | 9/2001 | Farnworth et al. |
| 6,307,171 B1 | 10/2001 | Beffa |
| 6,350,959 B1 | 2/2002 | Beffa |
| 6,363,295 B1 | 3/2002 | Akram |
| 6,363,329 B2 | 3/2002 | Beffa |
| 6,365,421 B2 | 4/2002 | Debenham et al. |
| 6,365,860 B1 | 4/2002 | Beffa |
| 6,365,861 B1 | 4/2002 | Beffa |
| 6,368,975 B1 | 4/2002 | Balasubramhanya et al. |
| 6,373,011 B1 | 4/2002 | Beffa |
| 6,373,566 B2 | 4/2002 | Zeimantz |
| 6,400,840 B2 | 6/2002 | Wilson et al. |
| 6,424,168 B1 | 7/2002 | Farnworth et al. |
| 6,427,092 B1 | 7/2002 | Jones et al. |
| 6,437,271 B1 | 8/2002 | Beffa |
| 6,441,897 B1 | 8/2002 | Zeimantz |
| 6,504,123 B2 | 1/2003 | Beffa |
| 6,529,793 B1 | 3/2003 | Beffa |
| 6,534,785 B1 | 3/2003 | Farnworth et al. |
| 6,553,276 B2 | 4/2003 | Akram et al. |
| 6,588,854 B2 | 7/2003 | Wilson et al. |
| 6,594,611 B2 | 7/2003 | Beffa |

| | | | |
|---|---|---|---|
| 6,613,590 B2 | 9/2003 | Simmons | |
| 6,636,068 B2 | 10/2003 | Farnworth | |
| 6,654,114 B2 * | 11/2003 | Zeimantz | 356/237.4 |
| 6,703,573 B2 | 3/2004 | Beffa | |
| 6,725,121 B1 | 4/2004 | Pasadyn et al. | |
| 6,788,993 B2 | 9/2004 | Beffa | |
| 6,895,538 B2 | 5/2005 | Benedix et al. | |
| 6,944,567 B2 | 9/2005 | Beffa | |
| 7,107,117 B2 | 9/2006 | Beffa | |
| 7,120,287 B2 | 10/2006 | Wilson et al. | |
| 7,120,513 B1 | 10/2006 | Akram et al. | |
| 7,124,050 B2 | 10/2006 | Beffa | |
| 7,155,300 B2 | 12/2006 | Akram et al. | |
| 7,169,625 B2 | 1/2007 | Davis et al. | |
| RE39,518 E | 3/2007 | Toprac et al. | |
| 7,337,034 B1 | 2/2008 | Lensing et al. | |
| 7,517,708 B2 | 4/2009 | Deshpande et al. | |
| 2005/0228606 A1 * | 10/2005 | Beffa | 702/119 |

FOREIGN PATENT DOCUMENTS

| | | | |
|---|---|---|---|
| JP | 58052814 A | 3/1983 | |
| JP | 58060529 A | 4/1983 | |
| JP | 61120433 A | 6/1986 | |
| JP | 02164017 A | 6/1990 | |
| JP | 02246312 A | 10/1990 | |
| JP | 04080949 A | 3/1992 | |
| JP | 04318911 A | 11/1992 | |
| JP | 05013529 A | 1/1993 | |
| JP | 05074909 | 3/1993 | |
| JP | 05121573 A | 5/1993 | |
| JP | 05315207 | 11/1993 | |
| JP | 06013443 A | 1/1994 | |
| JP | 06267809 A | 9/1994 | |
| JP | 06349691 A | 12/1994 | |
| JP | 07050233 | 2/1995 | |
| JP | 07066091 A | 3/1995 | |
| JP | 07-335510 | 12/1995 | |
| JP | 08162380 A | 6/1996 | |
| JP | 10104315 A | 4/1998 | |
| JP | 11008327 | 1/1999 | |
| SU | 1151333 A | 4/1985 | |

* cited by examiner

METHOD IN AN INTEGRATED CIRCUIT (IC) MANUFACTURING PROCESS FOR IDENTIFYING AND REDIRECTING ICS MIS-PROCESSED DURING THEIR MANUFACTURE

CROSS-REFERENCE TO RELATED APPLICATIONS

This application is a continuation of application Ser. No. 11/150,752, filed Jun. 10, 2005, now U.S. Pat. No. 7,124,050, issued Oct. 17, 2006, which is a continuation of application Ser. No. 10/600,148, filed Jun. 19, 2003, now U.S. Pat. No. 6,944,567, issued Sep. 13, 2005, which is a continuation of application Ser. No. 10/067,728, filed Feb. 4, 2002, now U.S. Pat. No. 6,594,611, issued Jul. 15, 2003, which is a continuation of application Ser. No. 09/793,938, filed Feb. 27, 2001, now U.S. Pat. No. 6,363,329, issued Mar. 26, 2002, which is a continuation of application Ser. No. 09/537,839, filed Mar. 29, 2000, now U.S. Pat. No. 6,208,947, issued Mar. 27, 2001, which is a continuation of application Ser. No. 09/302,338, filed Apr. 29, 1999, now U.S. Pat. No. 6,067,507, issued May. 23, 2000, which is a continuation of application Ser. No. 08/806,442, filed Feb. 26, 1997, now U.S. Pat. No. 5,915,231, issued Jun. 22, 1999, which is related to: Ser. No. 08/591,238, filed Jan. 17, 1996, now abandoned; Ser. No. 08/664,109, filed Jun. 13, 1996, now U.S. Pat. No. 5,895,962, issued Apr. 20, 1999; and Ser. No. 08/785,353, filed Jan. 17, 1997 now U.S. Pat. No. 5,927,512, issued Jul. 27, 1999.

BACKGROUND OF THE INVENTION

1. Field of the Invention

The present invention relates in general to integrated circuit (IC) manufacturing and, more specifically, to methods in IC manufacturing processes for identifying and redirecting ICs mis-processed during their manufacture.

2. State of the Art

As shown in FIG. 1, a typical process 10 for manufacturing very small electronic circuits referred to as "Integrated Circuits" (ICs) begins with the ICs being formed or "fabricated" on the surface of a wafer 12 of semiconductor material, such as silicon. Once fabricated, ICs are electronically probed to determine whether they are functional (i.e., "good") or non-functional (i.e., "bad"), and a computer then stores an electronic wafer map 14 of the wafer 12 identifying the locations of the good and bad ICs on the wafer 12.

After being probed, ICs are sawed from their wafer 12 into discrete IC dice or "chips" using high-speed precision dicing equipment. IC dice identified as good by their wafer map 14 are then each "picked" by automated equipment from their sawed wafer 12 and "placed" on an epoxy coated bonding site of a lead frame, while IC dice identified as bad are discarded into a scrap bin 16. The epoxy attaching the good IC dice to their lead frames is then allowed to cure, and the attached dice are wire bonded to their lead frames using high speed bonding equipment. At this point in the process 10, the lead frames of IC dice are still connected to other lead frames.

Once wire bonded, IC dice and their lead frames are formed into IC packages using a hot thermosetting plastic encapsulant injected into a mold. Leads of the lead frames project from the IC packages after encapsulation, and these leads are dipped in a cleansing chemical bath in a process referred to as "de-flash." After de-flash, IC packages are cured to set their plastic encapsulant, and their projecting leads are then electroplated with a lead/tin finish.

After lead finishing, connections between the lead frames of different IC packages are cut to "singulate" the IC packages into discrete IC devices. Discrete devices are then tested in a simple electronic test that checks for "opens" (i.e., no connection) within the devices where connections should exist and "shorts" (i.e., a connection) where connections should not exist. Devices that fail the opens/shorts test are discarded into the scrap bin 16, and devices that pass proceed to extensive back-end test procedures where they are tested for functionality and operability before being shipped to customers.

On occasion, bad IC dice are accidentally picked from a sawed wafer 12 for subsequent assembly and back-end testing as described above. This can happen, for example, because a human, software, or electronic error causes the automated pick and place equipment described above to access the wrong wafer map 14 for a wafer 12. It can also happen because of a misalignment, referred to as a "registration" error, between the automated pick and place equipment and a wafer 12. In either case, such accidents typically are not detected until the bad IC dice undergo at least some back-end testing and, as a result, waste back-end testing resources. Therefore, there is a need in the art for a method of identifying and discarding accidentally assembled IC dice before the dice undergo back-end testing procedures.

As described in U.S. Pat. Nos. 5,301,143, 5,294,812, and 5,103,166, some methods have been devised to electronically identify IC dice. Such methods take place "off" the manufacturing line, and involve the use of electrically retrievable identification (ID) codes, such as so-called "fuse IDs," programmed into individual IC dice to identify the dice. The programming of a fuse ID typically involves selectively blowing an arrangement of fuses or anti-fuses in an IC die so that when the fuses or anti-fuses are accessed, they output a selected ID code. Unfortunately, none of these methods addresses the problem of identifying and discarding accidentally assembled IC dice "on" a manufacturing line.

BRIEF SUMMARY OF THE INVENTION

The present invention provides a method that can identify and discard accidentally assembled integrated circuit (IC) dice "on" an IC manufacturing line before the dice undergo back-end testing procedures.

In one embodiment, the method identifies and redirects ICs that have been mis-processed, such as bad ICs identified at probe that have accidentally been assembled and packaged. The method includes storing data, such as an electronic wafer map, at probe, for example, in association with a unique identification (ID) code, such as a fuse ID, of each of the ICs. The stored data indicates a process flow within the IC manufacturing process that each of the ICs should undergo. For example, the stored data may indicate that an IC is bad and should be discarded, or that an IC is good and should be assembled and packaged.

As described above, on occasion, one or more ICs do not undergo the process flow they should undergo. For example, some bad ICs may proceed through assembly and packaging rather than being discarded. To check for ICs that have not undergone the process flow they should undergo, the present method also includes reading the ID code of each of the ICs at, for example, the opens/shorts test at the end of assembly. The data (e.g., the wafer map) stored in association with the ID code of each of the ICs is then accessed and evaluated to identify any ICs that have undergone a process flow within the IC manufacturing process that is different from the process flow their data indicates they should have undergone, such as bad ICs that have proceeded through assembly and packaging. Any ICs identified as having been mis-processed are then redirected within the IC manufacturing process. Thus, for example, bad ICs that have been assembled and packaged may be discarded so they do not proceed to back-end testing.

In another embodiment of the present invention, a method of manufacturing IC devices, such as Dynamic Random Access Memory Devices (DRAMs), from semiconductor wafers includes providing the semiconductor wafers and fabricating ICs on the wafers. A substantially unique ID code, such as a fuse ID, is then stored in each of the ICs, and data is stored in association with the ID code of each of the ICs that indicates a manufacturing process flow that each of the ICs should undergo. Each IC is then separated from its wafer to form an IC die, and the IC dice are assembled into IC devices, such as wire bond/lead frame devices, Chip On Board (COB) devices, or flip-chip devices. The ID code associated with each of the IC devices is then read, and the data stored in association with the ID code associated with each of the IC devices is accessed and evaluated to identify any IC devices that have undergone a manufacturing process flow that is different from the manufacturing process flow their data indicates they should have undergone. These identified IC devices are then redirected (e.g., discarded), and the remaining IC devices continue on to back-end testing.

A further embodiment of the present invention comprises a method of manufacturing Multi-Chip Modules (MCMs) similar to the method of manufacturing IC devices described above.

A still further embodiment of the present invention comprises another method of manufacturing IC devices from semiconductor wafers. The method includes providing the semiconductor wafers and fabricating ICs on the wafers. Each IC is electronically probed to identify good and bad ICs on the wafers and then programmed with a unique fuse ID. An electronic wafer map is stored for each wafer indicating the locations of good and bad ICs on the wafer and associating each IC on the wafer with its fuse ID. Each IC is then sawed from its wafer to form a discrete IC die that is automatically picked and placed on an epoxy coated bonding site of a lead frame. The epoxy is allowed to cure, and the IC dice are then wire bonded to their respective lead frames. Next, the IC dice and their associated lead frames are injection molded to form IC packages. Projecting leads of the packages are then deflashed, the packages are cured, and the leads are then electroplated. Then, each package is singulated to form a discrete IC device, and each device is tested for opens and shorts. The fuse ID associated with each IC device is then electrically retrieved so the wafer map stored in association with the fuse ID associated with each of the IC devices may be accessed and evaluated to identify any IC devices that include a bad IC and any IC devices that include a good IC. Any IC devices identified as including a bad IC are discarded, and any IC devices identified as including a good IC proceed to back-end testing.

DETAILED DESCRIPTION OF THE INVENTION

Figure 1:
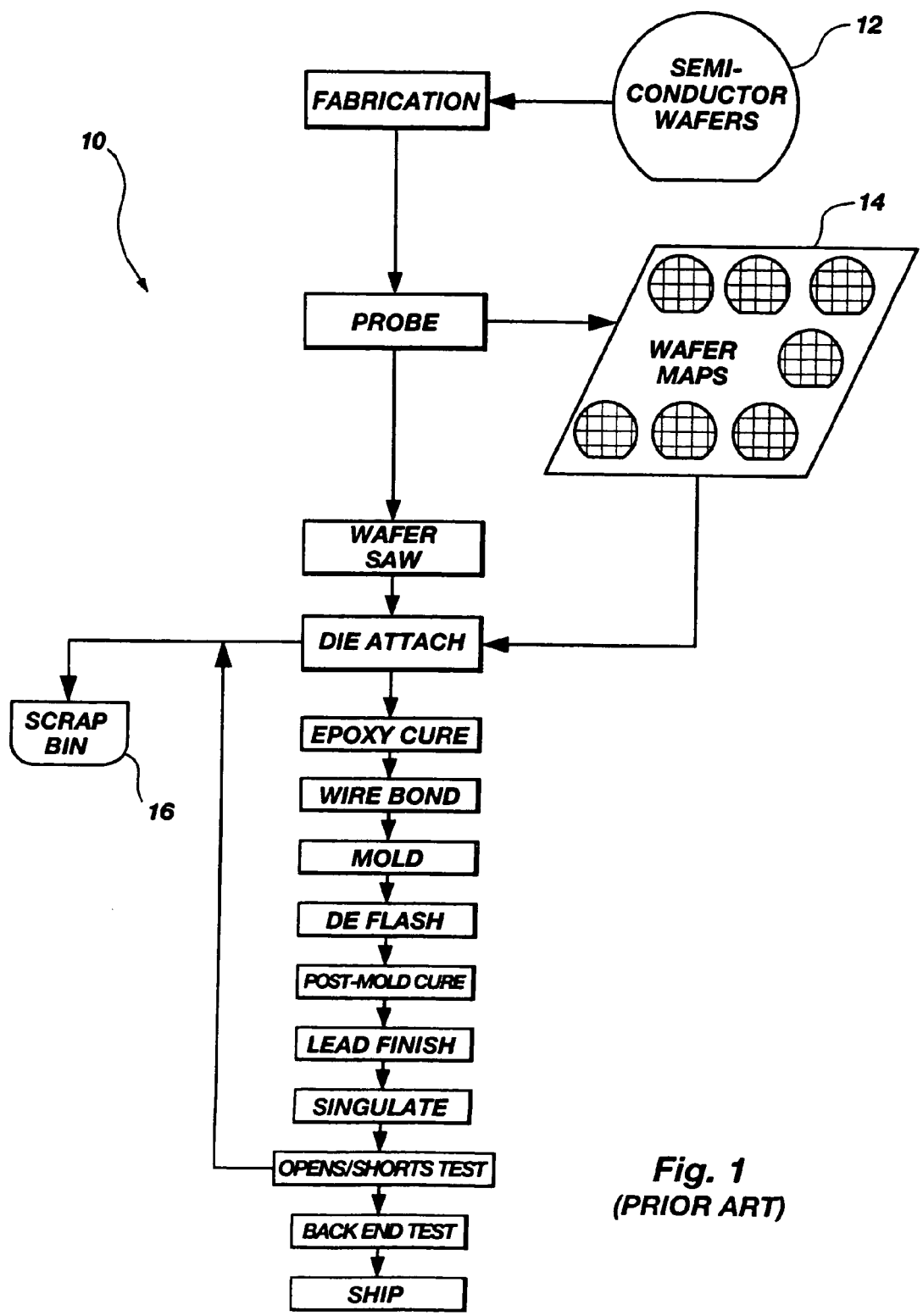
FIG. 1 is a flow diagram illustrating a conventional integrated circuit (IC) manufacturing process.
Figure 2:
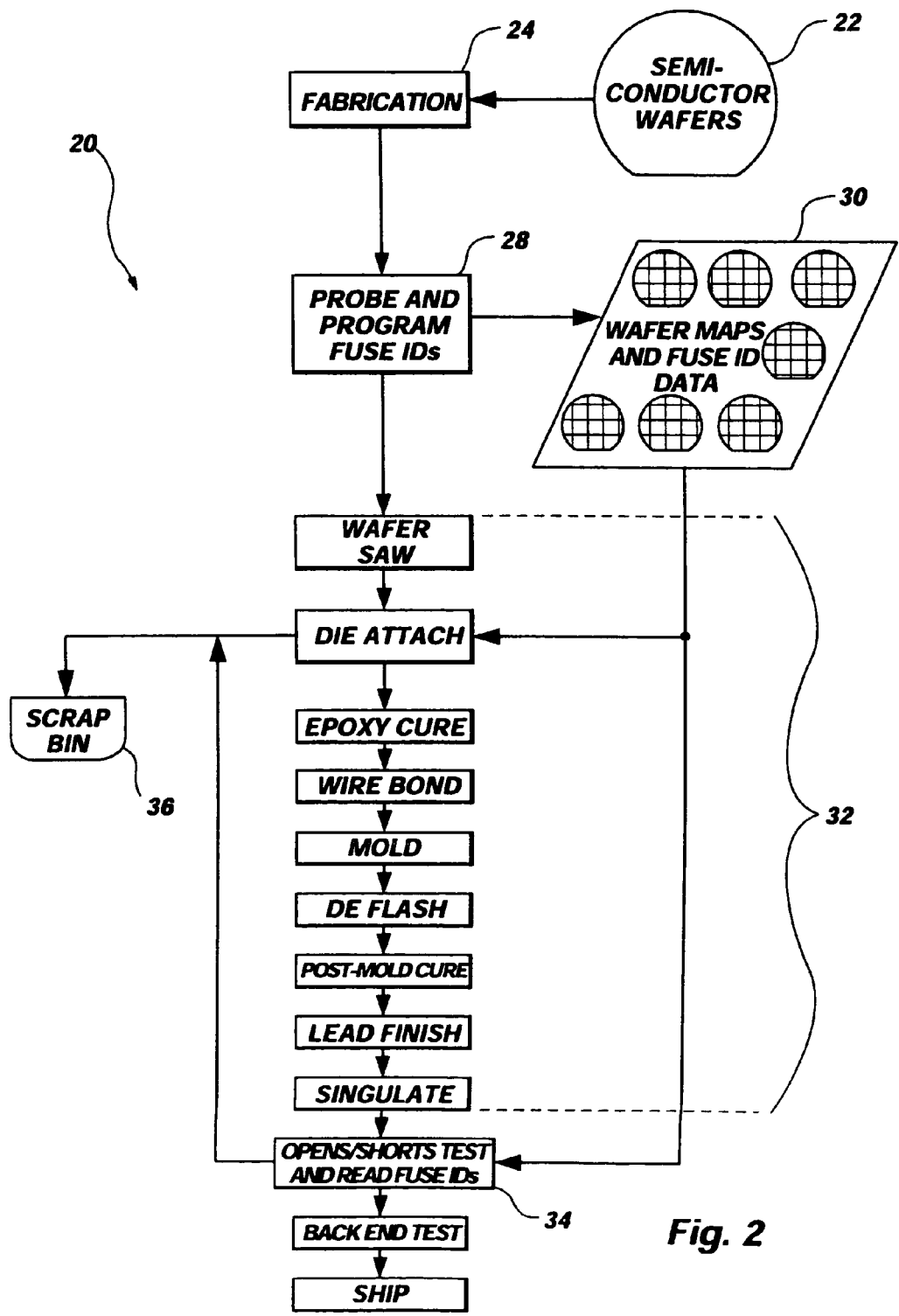
FIG. 2 is a flow diagram illustrating an IC manufacturing process in which accidentally assembled IC dice are identified and discarded in accordance with the present invention before back-end testing.

As shown in FIG. 2, an inventive method 20 for manufacturing integrated circuits (ICs) from a group of semiconductor wafers 22 includes the step 24 of fabricating the ICs on the wafers 22. It will be understood by those having skill in the field of this invention that the present invention is applicable to any IC devices, including Dynamic Random Access Memory (DRAM) ICs, Static Random Access Memory (SRAM) ICs, Synchronous DRAM (SDRAM) ICs, processor ICs, Single In-line Memory Modules (SIMMs), Dual In-line Memory Modules (DIMMs), and other Multi-Chip Modules (MCMs). It will also be understood that although the present invention will be described below in the context of a wire bond/lead frame assembly process, the present invention is applicable to any IC assembly process, including, for example, Chip On Board (COB), flip chip, and Tape-Automated Bonding (TAB) processes.

After fabrication, the ICs are electronically probed in a probe step 28 to evaluate a variety of their electronic characteristics, and data from the probe step 28 identifying bad and good ICs are noted and stored as wafer maps 30, as described above. During the probe step 28, ICs fabricated on the wafers 22 are programmed in the manner described above with a fuse identification (ID) unique to each IC. The fuse ID for each IC is then stored in association with the wafer maps 30 such that each die location on each wafer map 30 is associated with the unique fuse ID of a particular IC. The fuse ID may identify, for example, a wafer lot ID, the week the ICs were fabricated, a wafer ID, a die location on the wafer, and a fabrication facility ID.

It will be understood, of course, that the present invention includes within its scope ICs having any ID code, including those having fuse IDs. It will also be understood that the ICs may be programmed with their fuse IDs at steps in the manufacturing process of inventive method 20 other than the probe step 28.

Once programmed, the ICs proceed through an assembly process 32 to an opens/shorts test 34 as described above. At the opens/shorts test 34, the fuse ID of each IC is automatically read and correlated with the wafer map 30 of its wafer 22. If a bad IC has accidentally proceeded through the assembly process 32, the fuse ID of the IC, in correlation with the wafer map 30 of the ICs wafer 22, will identify the IC as a bad IC so it can be discarded to a scrap bin 36 instead of proceeding through back-end testing. The present invention thus provides a method of identifying and discarding accidentally assembled ICs before they undergo back-end testing.

It should be understood that although the fuse IDs of ICs in the process of inventive method 20 are typically read electronically, they may also be read optically if the fuse IDs consist of "blown" laser fuses that are optically accessible. It should also be understood that the present invention includes within its scope any method in an IC manufacturing process for identifying and redirecting ICs mis-processed during their manufacture using ID codes such as fuse IDs.

Although the present invention has been described with reference to a preferred embodiment, the invention is not limited to this embodiment. For example, while the various steps of the preferred embodiment have been described as occurring in a particular order, it will be understood that these steps need not necessarily occur in the described order to fall within the scope of the present invention. Thus, the invention is limited only by the appended claims, which include within their scope all equivalent methods that operate according to the principles of the invention as described.

What is claimed is:

1. A manufacturing process for an integrated circuit device having data from integrated circuit devices used in the process comprising:

storing the data from the manufacturing process for the integrated circuit device and a substantially unique identification code for each integrated circuit device of the integrated circuit devices on each integrated circuit device of the integrated circuit devices at probe testing of the integrated circuit devices and thereafter, the data indicating a first process flow or an another process flow within the manufacturing process for each integrated circuit device of the integrated circuit devices;

storing the substantially unique identification code of each integrated circuit device of the integrated circuit devices and a die location on an electronically stored wafer map for each integrated circuit device;

reading the substantially unique identification code stored on each integrated circuit device of the integrated circuit devices for evaluating each integrated circuit device of the integrated circuit devices with respect to the stored data from the manufacturing process for each integrated circuit device for identifying integrated circuit devices having the first process flow within the manufacturing process and indentifying integrated circuit devices having the another process flow different from the first process flow; and redirecting each integrated circuit device identified as having the another process flow within the manufacturing process different from the first process flow of the integrated circuit devices in the first process flow to prevent the integrated circuit device from continuing within the first process flow after reading the substantially unique identification code of the integrated circuit device.

2. The manufacturing process of claim 1, wherein storing the data from the manufacturing process for the integrated circuit device and a substantially unique identification code for each integrated circuit device of the integrated circuit devices on each integrated circuit device of the integrated circuit devices storing data and the devices to indicate each integrated circuit device of the integrated circuit devices comprises storing data indicating whether each integrated circuit device of the integrated circuit devices is one of a good integrated circuit device and a bad integrated circuit device.

3. The manufacturing process of claim 1, wherein reading the substantially unique identification code stored on each integrated circuit device of the integrated circuit devices comprises electrically retrieving a unique fuse identification programmed into each integrated circuit device of the integrated circuit devices.

4. The manufacturing process of claim 1, wherein reading the substantially unique identification code stored on each integrated circuit device of the integrated circuit devices comprises optically reading a unique identification code on each integrated circuit device of the integrated circuit devices.

5. The manufacturing process of claim 4, wherein optically reading the unique identification code on each integrated circuit device of the integrated circuit devices comprises optically reading a unique laser fuse identification programmed into each integrated circuit device of the integrated circuit devices.

6. The manufacturing process of claim 1, wherein reading the substantially unique identification code stored on each integrated circuit device of the integrated circuit devices comprises reading the substantially unique identification code of each integrated circuit device of the integrated circuit devices at an opens/shorts test in the manufacturing process.

7. The manufacturing process of claim 1, wherein the stored data and the substantially unique identification code of each integrated circuit device of the integrated circuit devices are accessed by accessing the stored data and the substantially unique identification code of each integrated circuit device of the integrated circuit devices at an opens/shorts test in the manufacturing process.

8. The manufacturing process of claim 7, wherein identifying integrated circuit devices having the first process flow within the manufacturing process and identifying integrated circuit devices having the another process flow didderent from the first process flow comprises identifying any bad integrated circuit devices having undergone an assembly procedure within the manufacturing process.

9. The manufacturing process of claim 8, wherein identifying integrated circuit devices having the first process flow within the manufacturing process and identifying integrated circuit devices having the another process flow different from the first process flow comprises identifying integrated circuit devices having the first first process flow within the manufacturing process and indentifying integrated circuit devices having the another process flow different from the first process flow at an opens/shorts test in the manufacturing process.

10. The manufacturing process of claim 1, wherein redirecting each integrated circuit device identified as having the another process flow within the manufacturing process different from the first process flow of the integrated circuit devices in the first process flow comprises discarding any integrated circuit device identified as having the another process flow within the manufacturing process different from the first process flow.

11. The manufacturing process of claim 1, wherein redirecting occurs before a back-end test procedure within the manufacturing process.

12. The manufacturing process of claim 1, further comprising assembling the integrated circuit devices into packaged integrated circuit devices after storing stored data and before reading the substantially unique identification code of each integrated circuit device of the integrated circuit devices.

* * * * *

UNITED STATES PATENT AND TRADEMARK OFFICE
CERTIFICATE OF CORRECTION

| | | |
|---|---|---|
| PATENT NO. | : 7,885,782 B2 | Page 1 of 1 |
| APPLICATION NO. | : 11/582141 | |
| DATED | : February 8, 2011 | |
| INVENTOR(S) | : Raymond J. Beffa | |

It is certified that error appears in the above-identified patent and that said Letters Patent is hereby corrected as shown below:

In column 1, line 22, delete "May." and insert -- May --, therefor.

In column 5, line 5, in Claim 1, delete "devicesat" and insert -- devices at --, therefor.

In column 5, line 6, in Claim 1, after "the" insert -- stored --.

In column 5, line 21, in Claim 1, delete "indentifying" and insert -- identifying --, therefor.

In column 5, lines 37-38, in Claim 2, after "devices" delete "storing data and the devices to indicate each integrated circuit device of the integrated circuit devices".

In column 6, line 23, in Claim 8, delete "didderent" and insert -- different --, therefor.

In column 6, line 32, in Claim 9, before "process" delete "first".

In column 6, line 33, in Claim 9, delete "indentifying" and insert -- identifying --, therefor.

Signed and Sealed this
Twenty-sixth Day of April, 2011

David J. Kappos
*Director of the United States Patent and Trademark Office*